United States Patent
Agilandam et al.

(10) Patent No.: US 6,995,559 B2
(45) Date of Patent: Feb. 7, 2006

(54) METHOD AND SYSTEM FOR OPTIMIZED PRE-SATURATION IN MR WITH CORRECTED TRANSMITTER FREQUENCY OF PRE-PULSES

(75) Inventors: Kasi Viswanathan Agilandam, Bangalore (IN); Masanam Mariappan, Bangalore (IN); Hemalatha Kolur, Bangalore (IN); Venkata Ramanan Swaminathan, Bangalore (IN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/696,947

(22) Filed: Oct. 30, 2003

(65) Prior Publication Data
US 2005/0093541 A1 May 5, 2005

(51) Int. Cl.
*G01V 3/00* (2006.01)
(52) U.S. Cl. .................... 324/309; 324/307; 324/318
(58) Field of Classification Search ........ 324/306–322, 324/300, 303; 600/410, 419
See application file for complete search history.

(56) References Cited

U.S. PATENT DOCUMENTS

| | | | | |
|---|---|---|---|---|
| 4,609,872 A | * | 9/1986 | O'Donnell .................. 324/306 |
| 4,680,551 A | | 7/1987 | O'Donnell et al. |
| 4,761,614 A | * | 8/1988 | Prammer et al. ........... 324/320 |
| 4,859,946 A | * | 8/1989 | Kuhara ....................... 324/309 |
| 4,885,542 A | * | 12/1989 | Yao et al. ................... 324/313 |
| 4,899,109 A | | 2/1990 | Tropp et al. |
| 4,970,457 A | * | 11/1990 | Kaufman et al. ........... 324/309 |
| 5,003,266 A | | 3/1991 | Palkovich et al. |
| 5,853,365 A | * | 12/1998 | Yamagata ................... 600/410 |
| 5,942,897 A | * | 8/1999 | Kanazawa ................... 324/309 |
| 6,064,205 A | * | 5/2000 | Zhou et al. ................. 324/309 |
| 6,177,795 B1 | * | 1/2001 | Zhu et al. ................... 324/307 |
| 6,515,478 B1 | * | 2/2003 | Wicklow et al. ............ 324/313 |
| 6,559,644 B2 | * | 5/2003 | Froundlich et al. ......... 324/315 |
| 6,627,003 B2 | | 9/2003 | Hayworth et al. |
| 6,700,374 B1 | * | 3/2004 | Wu et al. .................... 324/312 |
| 6,836,113 B2 | * | 12/2004 | Zhang ......................... 324/307 |
| 2002/0180438 A1 | * | 12/2002 | Froundlich et al. ......... 324/315 |
| 2003/0109781 A1 | * | 6/2003 | Zhang ......................... 600/410 |
| 2004/0140802 A1 | * | 7/2004 | Zhang ......................... 324/307 |
| 2005/0033156 A1 | * | 2/2005 | Kruger et al. .............. 600/410 |
| 2005/0093541 A1 | * | 5/2005 | Agilandam et al. ......... 324/309 |

* cited by examiner

*Primary Examiner*—Brij Shrivastav
*Assistant Examiner*—Tiffany A. Fetzner
(74) *Attorney, Agent, or Firm*—Carl B. Horton, Esq.; Armstrong Teasdale LLP

(57) ABSTRACT

A method, system and computer program product is provided for optimizing pre-saturation in Magnetic Resonance Imaging. The optimization is done by setting a correct transmitter frequency of RF pre-pulses for all scan slices. A $B_0$ magnetic field map for each scan slice of a scan volume is obtained from the $B_0$ magnetic field distribution in the scan volume. The $B_0$ magnetic field maps are used to calculate the median value of the $B_0$ magnetic field over each scan slice. A first frequency of RF pre-pulses is obtained by a standard procedure. A second frequency of RF pre-pulses is then calculated for each scan slice by adding the median value of the $B_0$ magnetic field over the scan slice to the first frequency of RF pre-pulses. Thereafter RF pre-pulses at the second frequency is applied to the scan slice.

13 Claims, 5 Drawing Sheets

METHOD AND SYSTEM FOR OPTIMIZED PRE-SATURATION IN MR WITH CORRECTED TRANSMITTER FREQUENCY OF PRE-PULSES

BACKGROUND OF THE INVENTION

The present invention relates to the field of Magnetic Resonance Imaging (MRI). More specifically, the invention relates to the field of pre saturation based MRI.

Magnetic Resonance Imaging is a useful imaging tool for non-invasive imaging of internal organs. One of the important reasons for the rise in popularity of MRI is the outstanding clarity of the MRI images. Also, MRI uses radio frequency waves rather than X-rays.

An MRI system works on the principle of magnetic resonance to obtain images of the human body. Human body tissues are composed of molecules like water and fat, which contain hydrogen atoms. The nuclei of hydrogen atoms have an associated magnetic moment, which is a measure of the net magnetic properties of the hydrogen nuclei. In a typical MRI system, electromagnets provide a strong magnetic field called the B.sub.0 ($B_0$) magnetic field. The $B_0$ magnetic field interacts with the magnetic moments of hydrogen nuclei and causes a fraction of the nuclei to align with the $B_0$ magnetic field. The $B_0$ magnetic field also causes the magnetic moments of the aligned nuclei to precess around $B_0$ magnetic field direction at a frequency called frequency of precession ($\omega$). The frequency of precession depends on strength of the $B_0$ magnetic field and the gyromagnetic ratio of the nucleus ($\gamma$), which is a characteristic property of the nucleus. Mathematically, $\omega$, $B_0$ and $\gamma$ are related as:

$$\omega = \gamma^* B_0 \quad \text{equation (1)}$$

The frequency of precession of the nucleus is called the Larmor frequency. The MRI system then applies radio frequency (RF) pulses at the Larmor frequency of hydrogen nuclei. The frequency of the applied RF pulses is called the transmit frequency. When the precessing hydrogen nuclei are exposed to the RF pulses at their Larmor frequency, magnetic resonance occurs. When magnetic resonance occurs, the precessing hydrogen nuclei emit energy in the form of specific radio frequency signals. The radio frequency signals generated by the resonating hydrogen nuclei in water molecules (present in the scan volume) are processed by the MRI system to generate an MRI image. In many applications, the radio frequency signals generated by the resonating hydrogen nuclei in molecules other than water are undesired because they may reduce the quality of the MRI image.

An MRI system images a volume of the human body called the scan volume. One of the ways to image a scan volume is by dividing the scan volume into a number of slices called scan slices. The scan slices are then imaged one by one. The images of these scan slices can then be combined to form an image of the scan volume. To successfully image a scan volume, the $B_0$ magnetic field must be homogeneous across the scan volume. $B_0$ magnetic field inhomogeneity across the scan volume can have an adverse impact on the quality of MRI images. Referring to equation (1), the transmit frequency (which is equal to the Larmor frequency) depends on the strength of the $B_0$ magnetic field. If the $B_0$ magnetic field is inhomogeneous, hydrogen nuclei at different locations of the scan volume will experience different $B_0$ magnetic field strengths. This implies that the transmit frequency to be applied for magnetic resonance to occur will vary across the scan volume. A typical MRI system uses a single transmit frequency for the entire scan volume. Due to this, there will be some nuclei in the scan volume that will not undergo magnetic resonance. These nuclei will not produce a proper radio frequency signal, which leads to a poor quality MRI image. Hence, to obtain a good quality MRI image, a homogeneous $B_0$ magnetic field across the scan volume is desirable.

A homogeneous $B_0$ magnetic field is especially desirable in MRI systems that use pre-saturation. Pre-saturation is a method used for suppressing undesired signals that reduce image quality. In pre-saturation, frequency selective saturation pulses called RF pre-pulses are applied before the RF pulses. The use of frequency selective RF pre-pulses suppresses the undesired signals. An example of such RF pre-pulses is fat saturation. Fat saturation is a technique that selectively suppresses undesired signals from hydrogen nuclei present in fat molecules. Selective suppression is achieved by applying specific fat saturation RF pre-pulses prior to the RF pulses.

Any inhomogeneity in the $B_0$ magnetic field can lead to wrong determination of frequency of RF pre-pulses with respect to the RF pulse used to excite hydrogen nuclei present in water molecules. The use of RF pre-pulses at a wrong frequency substantially affects the image quality. For example in fat saturation, the RF pre-pulses at a wrong frequency will not completely suppress the signals from hydrogen nuclei present in fat molecules. In some cases, the fat saturation pulses of a wrong frequency may suppress signals from hydrogen nuclei present in water molecules, thereby reducing the image quality. FIG. 1 shows the effect of $B_0$ magnetic field inhomogeneity on an MRI image. The MRI image shows poor fat saturation and unwanted suppression of signals from hydrogen nuclei present in water molecules.

Hence, there exists a need for a method to reduce the effect of $B_0$ magnetic field inhomogeneity in pre-saturation based MRI experiments.

BRIEF SUMMARY OF THE INVENTION

In accordance with one aspect of the present invention, a method is provided for optimizing pre-saturation in magnetic resonance imaging. The method first generates a $B_0$ field map of each scan slice of a scan volume. Thereafter, a first frequency of RF pre-pulses is obtained by a standard procedure. The $B_0$ field map of each scan slice is then used to calculate the median value of the $B_0$ magnetic field over each scan slice as well as the percentage of positive and negative scan slice pixels in each scan slice. In case the percentage of either the positive scan slice pixels or the negative scan slice pixels in each scan slice is greater than a predefined threshold value, a second frequency of RE pre-pulses is calculated for each scan slice. The second frequency of RE pre-pulses for a scan slice is calculated by adding the median value of the $B_0$ magnetic field over the scan slice to the first frequency of RF pre-pulses. However, when it is determined that the percentage value of positive scan slice pixels or the percentage value of negative scan slice pixels of a scan slice does not exceed the predetermined threshold value, a user of the MRI system is advised to improve shimming. After shimming has been improved by the user, the above-mentioned steps are repeated for each scan slice, until the percentage of either the positive scan slice pixels or the negative scan slice pixels exceeds the predefined threshold value. Thereafter, MRI images of the scan slices are obtained using the RF pre-pulses at the second frequency for each scan slice.

In accordance with another aspect of the present invention, an MRI system is provided for generating MRI images of a scan volume. The MRI system comprises a magnet for producing a high intensity magnetic field called the $B_0$ magnetic field. The MRI system further comprises a set of shimming coils for improving $B_0$ magnetic field homogeneity and a set of gradient coils for producing gradient magnetic fields superposed on the $B_0$ magnetic field. The gradient magnetic fields are used by the MRI system to select a specific region of the scan volume for magnetic resonance imaging. A database is provided, which stores the $B_0$ magnetic field distribution over each scan slice in the form of $B_0$ field maps. A processing module is provided for calculating a first frequency of RF pre-pulses for the scan slice. The processing module further calculates the median value of the $B_0$ magnetic field over each scan slice. The processing module further calculates a second frequency of RF pre-pulses for each scan slice by adding the median value of the $B_0$ magnetic field over the scan slice to the first frequency of RF pre-pulses. A transmitter is provided, which generates RF pre-pulses at the calculated second frequency for pre-saturation and RF pulses for causing magnetic resonance of the hydrogen nuclei in the scan volume. A detector is provided for detecting radio frequency signals generated due to magnetic resonance. The processing module processes the radio frequency signals generated due to magnetic resonance to obtain MRI images.

BRIEF DESCRIPTION OF THE DRAWINGS

Various embodiments of the present invention will hereinafter be described in conjunction with the appended drawings provided to illustrate and not to limit the present invention, wherein like designations denote like elements, and in which.

DETAILED DESCRIPTION OF THE INVENTION

The present invention relates to a method, system and computer program product for optimizing pre-saturation in magnetic resonance imaging. The optimization is done by setting a correct transmitter frequency of RF pre-pulses for all scan slices.

In one embodiment, the present invention is envisioned to be operating in conjunction with an MRI system using the technique of fat saturation. Fat saturation is a technique used to reduce interference from magnetic resonance signals generated by hydrogen nuclei present in fat molecules.

It will be apparent to a person skilled in the art that the present invention can be adapted to operate with MRI systems that use pre-saturation techniques other than fat saturation. For example, the present invention can find application in magnetization transfer for suppression of signals from macromolecules (such as proteins) and in spectroscopy experiments for suppression of signals from water molecules.

Figure 2A:
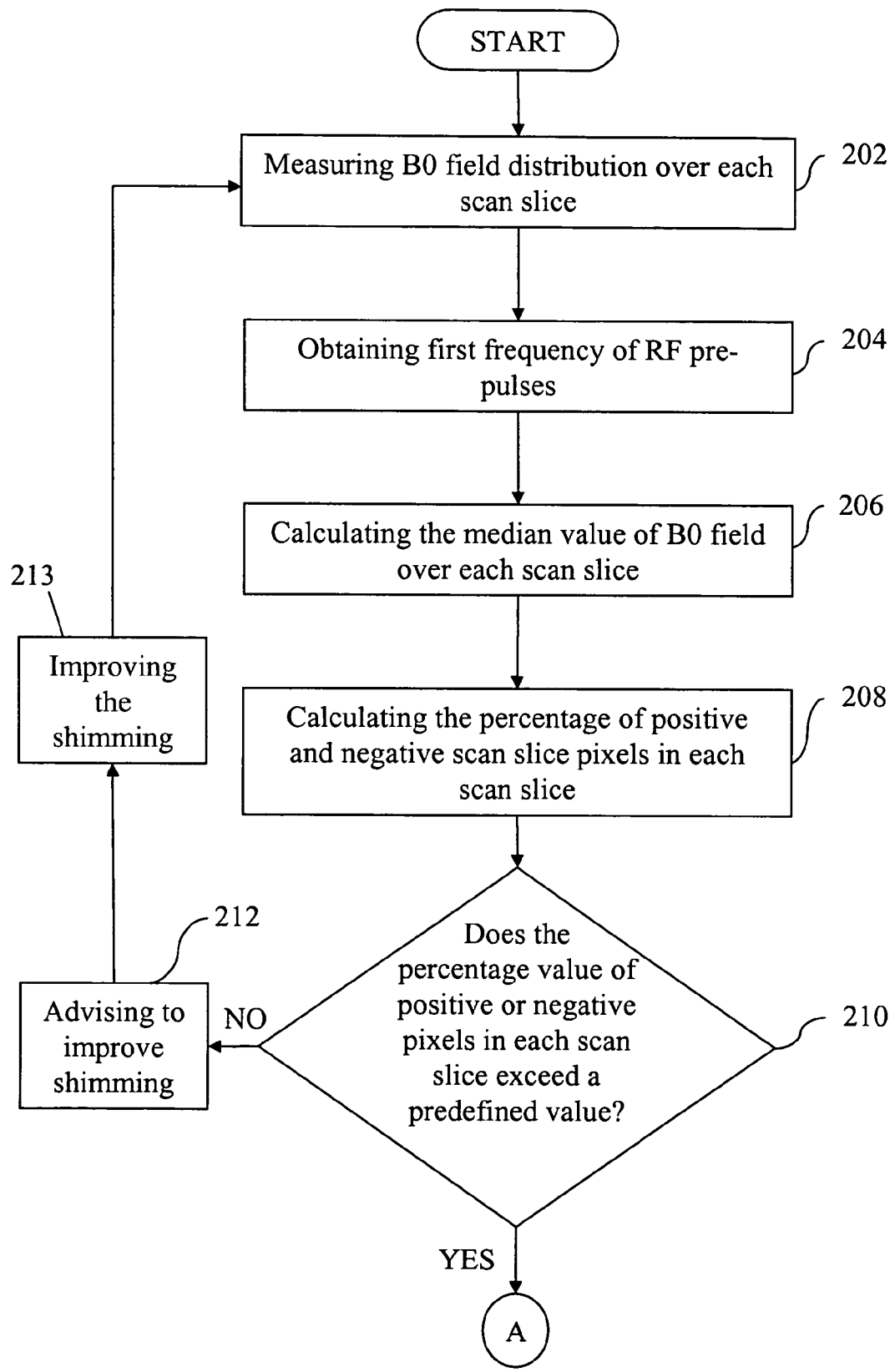
FIGS. 2A and 2B illustrate a flowchart depicting the steps involved in the method of optimizing pre-saturation in magnetic resonance imaging, in accordance with one embodiment of the present invention.
Figure 2B:
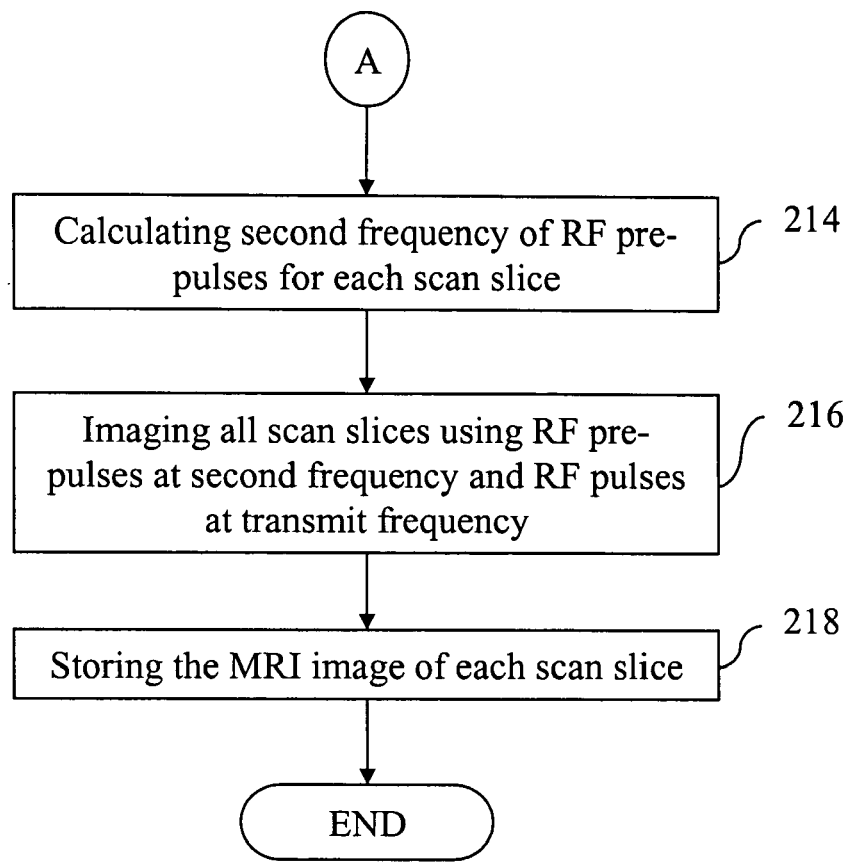

FIGS. 2A and 2B illustrate a flowchart depicting the steps involved in the method of optimizing pre-saturation in magnetic resonance imaging, in accordance with one embodiment of the present invention.

At step 202, distribution of the $B_0$ magnetic field over each scan slice of the scan volume is obtained. There exist several methods to obtain the $B_0$ magnetic field distribution. Some examples of such methods include dual gradient echo method, dual spin echo method and dual echo spiral scan. The $B_0$ magnetic field distribution is obtained as a $B_0$ field map of each scan slice. The $B_0$ field map of a scan slice is a map of the $B_0$ magnetic field over the scan slice. Value of a pixel of the $B_0$ field map of a scan slice is the frequency offset of the $B_0$ magnetic field over the pixel from the average $B_0$ magnetic field. In one embodiment of the present invention, the $B_0$ field maps are stored in a database.

At step 204, a first frequency for the RF pre-pulses is obtained by a standard procedure. The procedure involves calculating a transmit frequency for the RF pulses. This is done by an experiment that calculates the frequency at which the maximum hydrogen nuclei present in water molecules resonate. Once the transmit frequency has been calculated, the first frequency of the RF pre-pulse is calculated based on the difference between the frequencies at which fat and water molecules resonate at the average $B_0$ magnetic field. For example, at an average $B_0$ magnetic field of 1.5 Tesla, this frequency difference is 220 Hz. Thus, if the transmit frequency is set to 63,584,500 Hz then the RF pre-pulse frequency will be set to 63,584,280 Hz. The frequency 63,584,280 Hz will be the first frequency of RF pre-pulses.

The type and frequency of RF pre-pulses depend on the type of molecules whose magnetic resonance signals are to be suppressed. In one embodiment of the invention, the RF pre-pulses are used to suppress magnetic resonance signals from fat molecules.

At step 206, a median value of the $B_0$ magnetic field over each scan slice is calculated. Calculation of the median value of the $B_0$ magnetic field over a scan slice is done by calculating the median of the $B_0$ map pixel values of the scan slice. In one embodiment, the median value of the $B_0$ magnetic field over each scan slice is calculated using the $B_0$ field maps stored in a database.

At step 208, the percentage of positive scan slice pixels and negative scan slice pixels in each scan slice is calculated. The calculation is done for a scan slice in the following manner. First, the total number of positive and negative scan slice pixels in the scan slice is calculated. A positive scan slice pixel is defined as a pixel that has a positive or zero value on the $B_0$ field map of the scan slice. Similarly, a negative scan slice pixel is defined as a pixel that has a negative value on the $B_0$ field map of the scan slice. Thereafter, the total number of pixels in the scan slice is calculated.

The percentage of positive scan slice pixels in a scan slice is obtained by dividing the number of positive scan slice pixels in the scan slice by the total number of pixels in the scan slice. Similarly, the percentage of negative scan slice pixels in a scan slice is obtained by dividing the number of negative scan slice pixels in the scan slice by the total number of pixels in the scan slice. In one embodiment of the present invention, the percentage of positive scan slice pixels and negative scan slice pixels in each scan slice is calculated from the $B_0$ magnetic field maps stored in a database.

At step 210, a check is made for each scan slice to determine if either the percentage value of positive scan slice pixels or the percentage value of negative scan slice pixels of the scan slice, exceed a predetermined threshold value. In one embodiment of the present invention, the threshold value is 80%.

At step 210, when it is determined that for at least one scan slice, the percentage value of positive scan slice pixels or the percentage value of negative scan slice pixels of the scan slice does not exceed the predetermined threshold value, step 212 is performed.

At step 212, the user of the MRI system is advised to improve the shimming. It would be evident to one skilled in the art that there are many ways of improving the shimming. For example, if the MRI system is using a shim protocol that corrects only linear gradients in the $B_0$ magnetic field, the user may be advised to improve shimming by using a higher order shim protocol. The user can then improve the shimming at step 213 by following the advice.

After the shimming has been improved at step 213, the method returns to step 202.

Referring back to step 210, when it is determined that for each scan slice, the percentage value of positive scan slice pixels or the percentage value of negative scan slice pixels of the scan slice exceeds a predetermined threshold value, step 214 is performed.

At step 214, a second frequency of RF pre-pulses is calculated for each scan slice. The calculation of the second frequency of RF pre-pulses for a scan slice is done by using the median value of the $B_0$ magnetic field over the scan slice and the first frequency of RF pre-pulses. In one embodiment, the second frequency of RF pre-pulses for a scan slice is calculated by adding the median value of the $B_0$ magnetic field over the scan slice to the first frequency of RF pre-pulses.

At step 216, the scan slices are imaged. A scan slice is imaged by first applying RF pre-pulses at the second frequency calculated for the scan slice. Thereafter, RF pulses at transmit frequency are applied to the scan slice. Application of the RF pulses causes magnetic resonance of hydrogen nuclei present in the scan slice. When magnetic resonance occurs, the hydrogen nuclei generate radio frequency signals. The magnetic resonance signals are measured. The radio frequency signals are processed to obtain an MRI image of the scan slice. The use of RF pre-pulses at the second frequency suppresses unwanted radio frequency signals from molecules other than water molecules. In one embodiment of the present invention, the RF pre-pulses are used for fat saturation. In such an embodiment, the RF pre-pulses suppress unwanted magnetic resonance signals from hydrogen nuclei present in fat molecules.

At step 218, the MRI images obtained at step 216 are stored in a database. The MRI images stored at step 218 can then be displayed on a display device.

Figure 1:
FIG. 1 is an MRI image showing poor fat saturation and unwanted suppression of signals from hydrogen nuclei present in water molecules due to $B_0$ magnetic field inhomogeneity.
Figure 3:
FIG. 3 is an MRI image obtained from an MRI system using the method of the present invention.

FIG. 3 is an MRI image obtained from an MRI system using the method of the present invention. The MRI image of FIG. 3 shows improved fat saturation and reduced suppression of signals from hydrogen nuclei present in water molecules as compared to the MRI image in FIG. 1.

Figure 4:
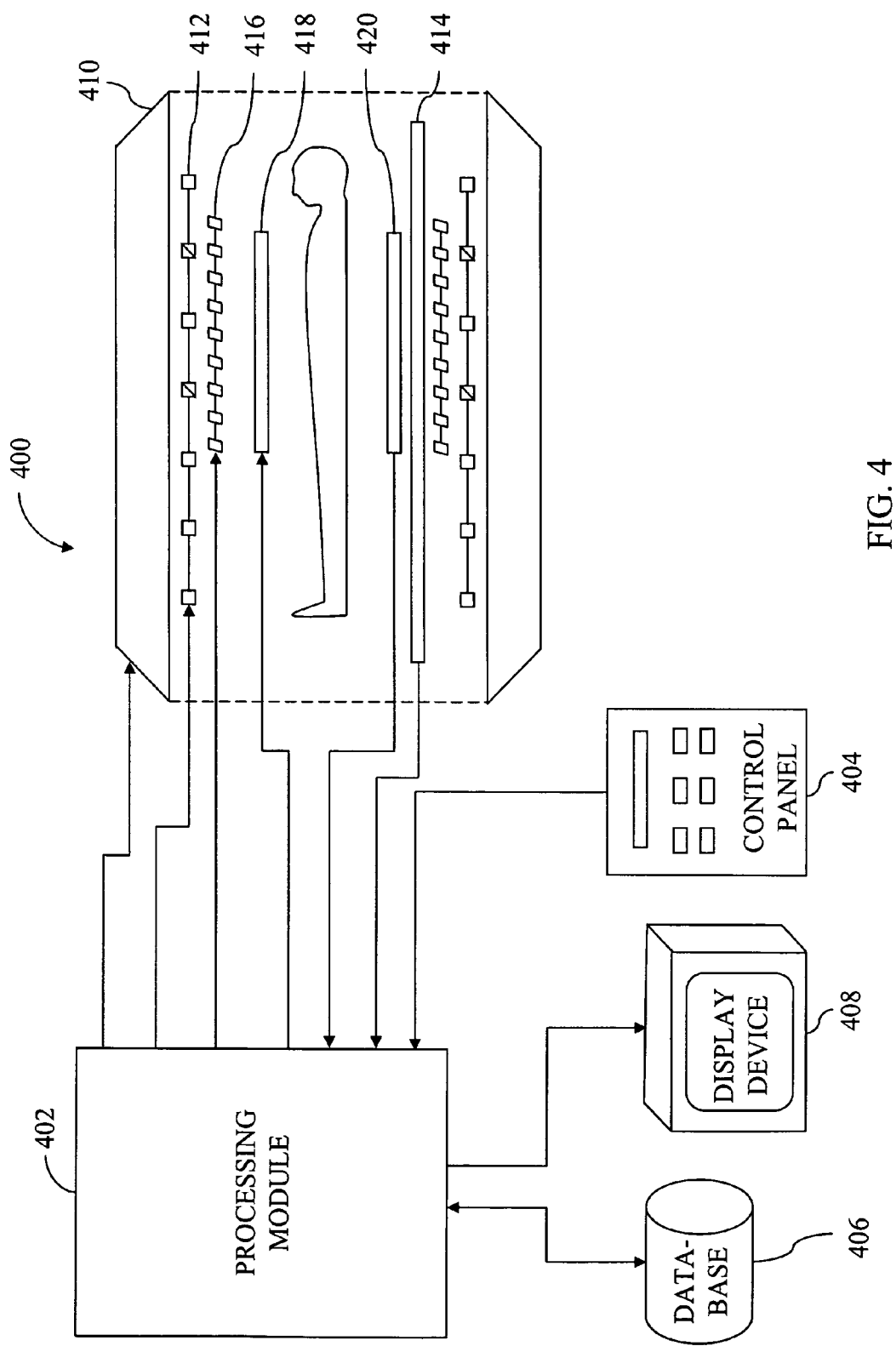
FIG. 4 is a block diagram showing the general working environment of an MRI system for pre-saturation based MRI in accordance with one embodiment of the present invention.

FIG. 4 is a block diagram showing the general working environment of an MRI system 400 for pre-saturation based MRI in accordance with one embodiment of the present invention.

MRI system 400 further comprises a processing module 402. Processing module 402 can be in the form of a general-purpose computer, a programmed microprocessor, a micro-controller, a peripheral integrated circuit element, and other devices or arrangements of devices. MRI system 400 further comprises a control panel 404 connected to processing module 402. A user can control the MRI system by entering commands from control panel 404.

MRI system 400 further comprises a database 406 and a display device 408 connected to processing module 402. Typical examples of display device 408 include liquid crystal displays (LCDs), cathode ray tubes (CRTs), light-emitting diode (LED) displays and television screens.

MRI system 400 further comprises a strong, polarizing magnet 410 and a set of shim coils 412, both connected to processing module 402. Magnet 410 generates a strong magnetic field called $B_0$ magnetic field over a scan volume. Shim coils 412 generate an additional magnetic field that reduces inhomogeneities in the magnetic field $B_0$ over the scan volume.

MRI system 400 further comprises a magnetic field detector 414 connected to processing module 402. Magnetic field detector 414 measures the $B_0$ magnetic field distribution over all scan slices of the scan volume and sends the $B_0$ magnetic field distribution data to processing module 402. Processing module 402 then generates a $B_0$ field map of all scan slices from the $B_0$ magnetic field distribution data. The $B_0$ field map of a scan slice is a map of the $B_0$ magnetic field over the scan slice. Thereafter, processing module 402 stores the $B_0$ field maps in database 406. Further, processing module 402 calculates the median of the $B_0$ magnetic field over each scan slice by calculating the median of pixel values of the $B_0$ field map. Thereafter, processing module 402 stores the calculated median values for each scan slice in database 406. Processing module 402 further calculates a second frequency of RF pre-pulses for each scan slice by correcting a first frequency of RF pre-pulses for the scan slice. (The first frequency of RF pre-pulses is obtained by a standard procedure). In one embodiment, the correction is done by adding the median value of the $B_0$ magnetic field over the scan slice to the first frequency of RF pre-pulses.

MRI system 400 further comprises a set of gradient coils 416 connected to processing module 402. Gradient coils 416 are current carrying coils that produce gradient magnetic fields. These gradient magnetic fields are superposed on the $B_0$ magnetic field by MRI system 400 to select a specific region of the scan volume for magnetic resonance imaging. In one embodiment, gradient coils 416 are three paired orthogonal current-carrying coils.

MRI system 400 further comprises a transmitter 418 connected to processing module 402. Transmitter 418 comprises a coil that generates RF pulses and RF pre-pulses.

The RF pulses (at the transmit frequency) generated by transmitter 418 cause magnetic resonance in hydrogen nuclei. Magnetic resonance causes hydrogen nuclei to generate radio frequency signals. The radio frequency signals generated by the hydrogen nuclei are detected by a receiver 420, connected to processing module 402. Receiver 420 comprises a coil or antenna, positioned within the scan volume and connected to the receiver circuitry to detect the radio frequency signals generated due to magnetic resonance. Receiver coils are of various types, for example, solenoidal, planar, volume, quadrature and phased array coils. Receiver 420 sends the detected radio frequency signals to processing module 402. Processing module 402 then processes the detected radio frequency signals and generates MRI images.

The MRI images generated by processing module 402 are stored in database 406. The images stored in database 406 are displayed on displaying device 408.

The system, as described in the present invention or any of its components may be embodied in the form of a processing machine. Typical examples of a processing machine include a general-purpose computer, a programmed microprocessor, a micro-controller, a peripheral integrated circuit element, and other devices or arrangements of devices, which are capable of implementing the steps that constitute the method of the present invention.

The processing machine executes a set of instructions in the form of a computer program code. The computer program code can be stored in one or more storage units in order to process input data. The storage units may be in the form of a database or a physical memory element present in the processing machine.

The computer program code may include various instructions that instruct the processing machine to perform specific tasks such as the steps that constitute the method of the present invention. The computer program code may be in various forms, such as system software or application software. Further, the computer program code can be in the form of a collection of separate programs, a program module with a larger program or a portion of a program module. The computer program code can be written in any programming language such as C, C++, C#, Java etc. The processing of input data by the processing machine may be in response to user commands, or in response to results of previous processing or in response to a request made by another processing machine.

It will be apparent to a person skilled in the art that it is not necessary for the various processing machines and/or storage units to be physically located in the same geographical location. The processing machines and/or storage units can be located in geographically distinct locations and connected to each other to enable communication. Various communication technologies can be used to enable communication between the processing machines and/or storage units. Such communication technologies can use various protocols such as TCP/IP, UDP, ATM or OSI. Such technologies include connection of the processing machines and/or storage units, in the form of a network. The network can be an intranet, an extranet, the Internet or any client server models that enable communication.

In the system and method of the present invention, a variety of "user interfaces" can be utilized to allow a user to interface with the processing machine or machines that are used to implement the present invention. The user interface is used by the processing machine to interact with a user in order to convey or receive information. The user interface can be any hardware, software, or a combination of hardware and software used by the processing machine that allows a user to interact with the processing machine. The user interface can be in the form of a dialogue screen and can include various associated devices to enable communication between a user and a processing machine. It is contemplated that the user interface can interact with another processing machine rather than a human user. Further, it is also contemplated that the user interface can interact partially with other processing machines while also interacting partially with the human user.

While the various embodiments of the present invention have been illustrated and described, it will be clear that the present invention is not limited to these embodiments only. Numerous modifications, changes, variations, substitutions and equivalents will be apparent to those skilled in the art without departing from the spirit and scope of the present invention as described in the claims.

What is claimed is:

1. A method of scanning a volume in an MRI system, comprising:
    a. creating a $B_0$ magnetic field;
    b. creating a $B_0$ map for each slice of a scan volume from the $B_0$ magnetic field, each scan slice having a plurality of positive and negative scan slice pixels;
    c. obtaining a first frequency of RF pre-pulses for each scan slice;
    d. calculating a median value of the $B_0$ magnetic field from the $B_0$ map for each scan slice;
    e. calculating percentages of the positive and negative scan slice pixels in each scan slice.

2. The method of claim 1 further comprising applying a plurality of RF pre-pulses in order to suppress magnetic resonance signals from hydrogen nuclei in fat molecules present in the scan volume.

3. The method of claim 1 comprising applying a plurality of RF pre-pulses in order to suppress magnetic resonance signals from hydrogen nuclei in macromolecules present in the scan volume.

4. The method of claim 1 further comprising applying a plurality of RF pre-pulses in order to suppress magnetic resonance signals from hydrogen nuclei in water molecules present in the scan volume.

5. A method of imaging a scan volume in an MRI system, comprising:
    a. generating a $B_0$ field map of each scan slice of a scan volume by measuring a $B_0$ magnetic field over each scan slice of the scan volume, each scan slice having a plurality of positive and negative scan slice pixels;
    b. obtaining a first frequency of RF pre-pulses;
    c. calculating a median value of the $B_0$ magnetic field over each scan slice, the calculation being done using the $B_0$ field maps;
    d. calculating percentages of the positive and negative scan slice pixels in each scan slice, the calculation being done using the $B_0$ field map for each scan slice, wherein a positive scan slice pixel is defined as a scan slice pixel with positive value in the $B_0$ field map, and wherein a negative scan slice pixel is defined as a scan slice pixel with negative value in the $B_0$ field map;
    e. wherein when the percentage of either the positive scan slice pixels or the negative scan slice pixels in each scan slice is greater than a predefined threshold value, performing the step of:
        i. calculating a second frequency of RF pre-pulses for each scan slice by correcting the first frequency of RF pre-pulses, the correction for a scan slice being done by using the median value of the $B_0$ magnetic field over the scan slice calculated at step c; otherwise:
        ii. improving shimming of the $B_0$ magnetic field with a shim protocol; and
        iii. repeating steps a through e; and
    f. obtaining an MRI image of each scan slice, wherein the MRI image of a scan slice is obtained using RF pre-pulses at the second frequency for the scan slice.

6. The method of claim 5 wherein the step of calculating a second frequency of RF pre-pulses for a scan slice is done by adding the median value of the $B_0$ magnetic field over the scan slice to the first frequency of RF pre-pulses.

7. The method of claim 2 wherein the step of obtaining an MRI image of a scan slice comprises the steps of:
   a. applying
      i. RF pre-pulses at second frequency for the scan slice; and
      i. RF pulses at transmit frequency to the scan slice;
   b. measuring magnetic resonance signals from the scan slice; and
   c. processing the magnetic resonance signals to obtain an MRI image of the scan slice.

8. A method of imaging a scan volume in an MRI system, comprising:
   a. generating a $B_0$ field map of each scan slice of a scan volume by measuring a $B_0$ magnetic field over each scan slice of the scan volume and storing the $B_0$ field map in a database, each scan slice having a plurality of positive and negative scan slice pixels;
   b. obtaining a first frequency of RF pre-pulses for each scan slice;
   c. calculating median value of the $B_0$ magnetic field over each scan slice, the calculation being done using the $B_0$ field maps stored in the database;
   d. calculating percentages of the positive and negative scan slice pixels in each scan slice, the calculation being done using the $B_0$ field map for each scan slice wherein a positive scan slice pixel is defined as a scan slice pixel with positive value in the $B_0$ field map, and wherein a negative scan slice pixel is defined as a scan slice pixel with negative value in the $B_0$ field map;
   e. wherein when the percentage of either the positive scan slice pixels or the negative scan slice pixels in each scan slice is greater than a predefined threshold value, performing the step of:
      i. calculating a second frequency of RF pre-pulses for each scan slice by correcting the first frequency of RF pre-pulses, the correction for a scan slice being done by adding the median value of the $B_0$ magnetic field over the scan slice calculated at step c to the first frequency of RF pre-pulses calculated at step b;
   otherwise:
      ii. improving shimming of the $B_0$ magnetic field with a shim protocol; and
      iii. repeating steps a through e;
   f. obtaining an MRI image of each scan slice using RF pre-pulses at second frequency for that scan slice;
   g. storing the MRI image of each scan slice obtained at step f in the database; and
   h. displaying the MRI images stored in the database on a display device.

9. The method of claim 8 wherein the RF pre-pulses are used in order to suppress magnetic resonance signals from hydrogen nuclei in fat molecules present in the scan volume.

10. The method of claim 8 wherein the step of obtaining an MRI image of a scan slice comprises the steps of:
   a. applying
      i. RF pre-pulses at second frequency for the scan slice; and
      ii. RF pulses at transmit frequency to the scan slice;
   b. measuring magnetic resonance signals from the scan slice; and
   c. processing the magnetic resonance signals to obtain an MRI image of the scan slice.

11. An MRI system comprising:
   a. a polarizing magnet configured to produce a high intensity magnetic field called a $B_0$ magnetic field;
   b. a set of shimming coils configured to improve homogeneity of the $B_0$ magnetic field;
   c. a magnetic field detector configured to measure a $B_0$ magnetic field distribution from the $B_0$ magnetic field;
   d. a set of gradient coils configured to produce a gradient magnetic field superposed on the $B_0$ magnetic field;
   e. a transmitter configured to generate RF pulses and RF pre-pulses wherein frequency of RF pre-pulses is specific for each scan slice, each scan slice having a plurality of positive and negative scan slice pixels;
   f. a radio frequency receiver configured to detect magnetic resonance signals;
   g. a processing module comprising:
      i. a module configured to calculate the median of the $B_0$ magnetic field distribution map over each scan slice, wherein the $B_0$ magnetic field distribution map is generated from the $B_0$ magnetic field distribution;
      ii. a module configured to calculate percentages of the positive and negative scan slice pixels in each scan slice, wherein positive scan slice pixels are defined as scan slice pixels with positive $B_0$ magnetic field values, and wherein negative scan slice pixels are defined as scan slice pixels with negative $B_0$ magnetic field values;
      iii. a module configured to calculate a second frequency of RF pre-pulses for each scan slice by adding the median value of a $B_0$ magnetic field distribution map over the scan slice to a first frequency of RF pre-pulses, the first frequency of RF pre-pulses being obtained by a standard procedure; and
      iv. a module configured to process magnetic resonance signals from a scan slice in order to obtain an MRI image of each scan slice; and
   h. a database comprising:
      i. a storage unit configured to store $B_0$ field distribution maps;
      ii. a second storage unit configured to store the median value of the $B_0$ magnetic field distribution map over each scan slice; and
      iii. a third storage unit configured to store an MRI image of each scan slice.

12. A computer program product configured for use with a computer, the computer program product comprising a computer usable medium having a computer readable program code embodied therein generating an image with an MRI system, the computer program code performing the steps of:
   a. generating a $B_0$ field map of each scan slice of a scan volume by measuring a $B_0$ magnetic field over each scan slice of the scan volume, each scan slice having a plurality of positive and negative scan slice pixels;
   b. obtaining a first frequency of RF pre-pulses;
   c. calculating median value of the $B_0$ magnetic field over each scan slice, the calculation being done using the $B_0$ field maps;
   d. calculating percentages of the positive and negative scan slice pixels in each scan slice, the calculation being done using the $B_0$ field map for each scan slice, wherein a positive scan slice pixel is defined as a scan slice pixel with positive value in the $B_0$ field map, and wherein a negative scan slice pixel is defined as a scan slice pixel with negative value in the $B_0$ field map;
   e. wherein when the percentage of either the positive scan slice pixels or the negative scan slice pixels in each scan slice is greater than a predefined threshold value, performing the step of:
      i. calculating a second frequency of RF pre-pulses for each scan slice by correcting the first frequency of RF pre-pulses, the correction for a scan slice being done by adding the median value of the $B_0$ magnetic field over the scan slice to the first frequency of RF pre-pulses;

otherwise:

ii. improving shimming of the $B_0$ magnetic field with a shim protocol; and iii. repeating steps a through e; and f. obtaining an MRI image of each scan slice, wherein the MRI image of a scan slice is obtained using RF pre-pulses at the second frequency for the scan slice.

13. A computer program product configured for use with a computer, the computer program product comprising a computer usable medium having a computer readable program code embodied therein acquiring an image with an MRI system, the computer program code performing the steps of:

a. generating a $B_0$ field map of each scan slice of a scan volume by measuring a $B_0$ magnetic field over each scan slice of the scan volume and storing the $B_0$ map in a database, each scan slice having a plurality of positive and negative scan slice pixels;

b. obtaining a first frequency of RF pre-pulses for each scan slice;

c. calculating median value of the $B_0$ magnetic field over each scan slice, the calculation being done using the $B_0$ field maps stored in the database;

d. calculating percentages of the positive and negative scan slice pixels in each scan slice, the calculation being done using the $B_0$ field map for each scan slice wherein a positive scan slice pixel is defined as a scan slice pixel with positive value in the $B_0$ field map, and wherein a negative scan slice pixel is defined as a scan slice pixel with negative value in the $B_0$ field map;

e. wherein when the percentage of either the positive scan slice pixels or the negative scan slice pixels in each scan slice is greater than a predefined threshold value, performing the step of:

i. calculating a second frequency of RF pre-pulses for each scan slice by correcting the first frequency of RF pre-pulses, the correction for a scan slice being done by adding the median value of the $B_0$ magnetic field over the scan slice to the first frequency of RF pre-pulses;

otherwise:

ii. improving shimming of the $B_0$ magnetic field with a shim protocol; and repeating steps a through e;

f. obtaining an MRI image of each scan slice using RF pre-pulses at second frequency for that scan slice calculated at step e;

g. storing the MRI image of each scan slice obtained at step f in the database; and h. displaying the MRI images stored in the database on a display device.

* * * * *

UNITED STATES PATENT AND TRADEMARK OFFICE
CERTIFICATE OF CORRECTION

PATENT NO. : 6,995,559 B2 Page 1 of 1
APPLICATION NO. : 10/696947
DATED : February 7, 2006
INVENTOR(S) : Agilandam et al.

It is certified that error appears in the above-identified patent and that said Letters Patent is hereby corrected as shown below:

In Claim 7, column 9, line 6, delete "i. RF pulses at transmit" and insert -- ii. RF pulses at transmit --.

In Claim 8, column 9, line 47, delete "step fin the" and insert therefor -- step f in the --.

In Claim 13, column 12, line 23, delete "step fin the" and insert therefor -- step f in the --.

Signed and Sealed this

Twenty-ninth Day of April, 2008

JON W. DUDAS
*Director of the United States Patent and Trademark Office*